United States Patent [19]
McCollum

[11] Patent Number: 5,866,937
[45] Date of Patent: Feb. 2, 1999

[54] DOUBLE HALF VIA ANTIFUSE

[75] Inventor: John L. McCollum, Sunnyvale, Calif.

[73] Assignee: Actel Corporation, Sunnyvale, Calif.

[21] Appl. No.: 482,270

[22] Filed: Jun. 7, 1995

Related U.S. Application Data

[63] Continuation-in-part of Ser. No. 231,634, Apr. 22, 1994, Pat. No. 5,552,627, which is a continuation-in-part of Ser. No. 4,912, Jan. 19, 1993, Pat. No. 5,411,917, which is a continuation of Ser. No. 604,779, Oct. 26, 1990, Pat. No. 5,181,096, which is a continuation-in-part of Ser. No. 508,306, Apr. 12, 1990, Pat. No. 5,070,384.

[51] Int. Cl.$^6$ ........................................... H01L 29/00
[52] U.S. Cl. ................................ 257/530; 257/50
[58] Field of Search ....................... 257/530, 50

[56] References Cited

U.S. PATENT DOCUMENTS

| | | | |
|---|---|---|---|
| 4,732,865 | 3/1988 | Evans et al. ........................ | 437/12 |
| 4,948,459 | 8/1990 | van Laarhoven et al. ............ | 156/643 |
| 5,427,979 | 6/1995 | Chang ................................ | 257/530 |
| 5,440,167 | 8/1995 | Iranmanesh ........................ | 257/530 |

FOREIGN PATENT DOCUMENTS

| | | | |
|---|---|---|---|
| 39 27 033 | 3/1990 | Germany ........................ | H01L 45/00 |

*Primary Examiner*—J. Carroll
*Attorney, Agent, or Firm*—D'Alessandro & Ritchie

[57] ABSTRACT

An antifuse comprises a substantially planar conductive lower electrode covered by a first layer of silicon nitride. A layer of amorphous silicon is disposed over the silicon nitride layer. A first dielectric layer is disposed over the surface of the amorphous silicon layer and has a first aperture therethrough communicating with the amorphous silicon layer. A second layer of silicon nitride is disposed over the first dielectric layer and in the first aperture. A conductive upper electrode, such as a layer of titanium nitride, is disposed over the second layer of silicon nitride. A second dielectric layer is disposed over the surface of the conductive upper electrode and has a second aperture therethrough in alignment with the first aperture communicating with the conductive upper electrode. An overlying metal layer is disposed over the surface of the second dielectric layer and in the second aperture making electrical contact with the conductive upper electrode.

2 Claims, 2 Drawing Sheets

DOUBLE HALF VIA ANTIFUSE

RELATED APPLICATIONS

This application is a continuation-in-part of application Ser. No. 08/231,634, filed Apr. 22, 1994, U.S. Pat. No. 5,552,627, which is a continuation-in-part of application Ser. No. 08/004,912, filed Jan. 19, 1993, now U.S. Pat. No. 5,411,917, which is a continuation of application Ser. No. 07/604,779, filed Oct. 26, 1990, now U.S. Pat. No. 5,181,096, which is a continuation-in-part of application Ser. No. 07/508,306, filed Apr. 12, 1990, now U.S. Pat. No. 5,070,384.

BACKGROUND OF THE INVENTION

1. Field of the Invention

The present invention relates to antifuse devices. More particularly, the present invention relates to a double-half-via antifuse structure and to fabrication methods therefor.

2. The Prior Art

Antifuses have fallen into one of two categories. A first category of antifuse has a lower electrode formed from a doped region in a semiconductor substrate and an upper electrode formed in a conductive layer above the substrate. The conductive layer has comprised either a metal or a polysilicon layer. A second category of antifuse has its lower electrode located in a layer above and insulated from the sericonductor or other substrate. The lower and upper electrodes are typically formed from metals, most often comprising portions of two metal interconnect layers in the integrated circuit. Above-the-substrate antifuses often employ amorphous silicon as an antifuse material disposed in between the two conductive electrodes.

Numerous above-substrate antifuses are known in the art. Most such antifuses are metal-to-metal antifuses which are typically disposed between two metal interconnect layers in an integrated circuit. Examples of such antifuses are found in references such as U.S. Pat. No. 5,300,456 to Tigelaar et al., U.S. Pat. No. 4,914,055 to Gordon et al.

While above-the-substrate antifuses are useful devices, they tend to suffer from one or more problems including poor BVG (programming or breakdown voltage) control resulting from lack of control of the overetch of the amorphous silicon layer during the via etching of the thick interlayer dielectric separating the antifuse electrodes, and step coverage problems, etc.

It is thus an object of the present invention to provide an antifuse which has a lower sensitivity to etch selectivity during the antifuse via etching process.

Another object of the present invention is to provide an antifuse which avoids the problem of depositing an upper electrode material into a deep antifuse via.

Yet another object of the present invention is to provide an antifuse with improved BVG control.

BRIEF DESCRIPTION OF THE INVENTION

According to a preferred embodiment of the present invention, an antifuse comprises a substantially planar conductive lower electrode covered by a first layer of silicon nitride. A layer of amorphous silicon is disposed over the silicon nitride layer. A first dielectric layer is disposed over the upper surface of the amorphous silicon layer and has a first aperture therethrough communicating with the amorphous silicon layer. A second layer of silicon nitride is disposed in the first aperture and over the first dielectric layer. A conductive upper electrode, such as a layer of titanium nitride, is disposed over the second layer of silicon nitride. A second dielectric layer is disposed over the surface of the conductive upper electrode and has a second aperture therethrough in alignment with the first aperture communicating with the conductive upper electrode. An overlying metal layer is disposed over the surface of the second dielectric layer and in the second aperture making electrical contact with the conductive upper electrode.

According to another embodiment of the invention, a thin layer of silicon dioxide is disposed over the amorphous silicon layer in the first aperture in place of the second silicon nitride layer. According to a variation of this embodiment, the second layer of silicon nitride may also be employed and is positioned over the thin silicon dioxide layer in the first aperture.

According to yet another embodiment of the present invention, a substantially planar conductive lower electrode is covered by a first layer of silicon nitride. A thin layer of silicon dioxide is disposed over the upper surface of the first silicon nitride layer. A layer of amorphous silicon is disposed over the silicon nitride layer. A first dielectric layer is disposed over the upper surface of the amorphous silicon layer and has a first aperture therethrough communicating with the amorphous silicon layer. A second layer of silicon nitride is disposed in the first aperture and over the first dielectric layer.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
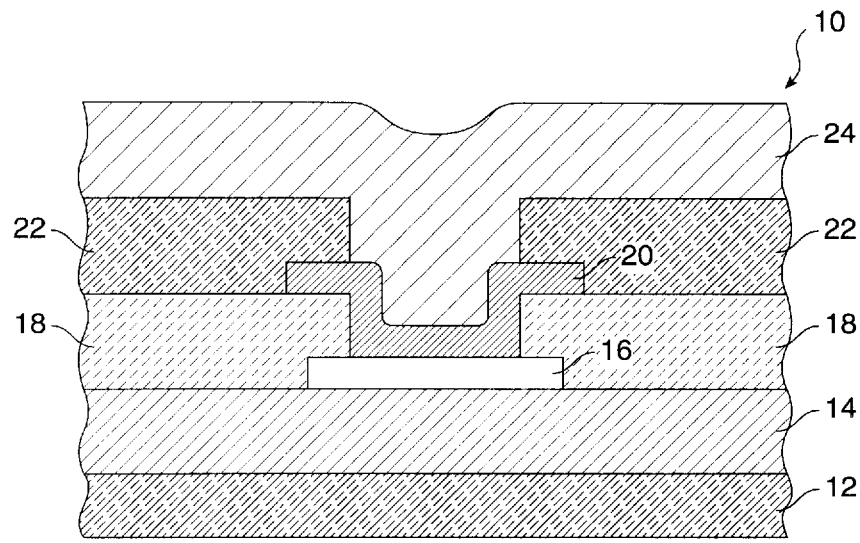
FIG. 1 is a cross-sectional view of an antifuse according to the present invention.

Referring first to FIG. 1, the architecture of an antifuse 10 according to the present invention is shown in cross-sectional view. Antifuse 10 may be referred to as a "double-half-via" antifuse because, as will be apparent from the disclosure herein, the antifuse via or aperture is formed in two stages during the antifuse fabrication process.

Antifuse 10 is formed over layer 12. Layer 12 may comprise an insulating substrate, an insulating layer disposed above a conductive or semiconductor substrate, or an insulating layer formed over active electronic devices such as a CMOS or other type of integrated circuit. A portion of a conductive layer forms the lower electrode 14 of antifuse 10. Lower electrode 14 will usually comprise a metal interconnect layer in an integrated circuit since antifuse 10 is particularly useful as a metal-to-metal antifuse. However, those of ordinary skill in the art will readily appreciate that the conductive layer of which lower electrode 14 is a part may be formed from other conductive materials.

Antifuse 10 includes a layer of antifuse material 16. An antifuse material is a material which presents an extremely high resistance prior to programming the antifuse. During programming, the antifuse material 16 is disrupted and a conductive link is formed therethrough between the upper and lower electrodes. As will be disclosed more fully herein with reference to FIG. 2, it is preferred to employ a multi-layer "stacked" antifuse material comprising at least two layers of different materials stacked on one another. A portion of the stacked antifuse material is disposed within a first antifuse via and another portion of the antifuse material is outside the first antifuse via according to a presently preferred embodiment of the invention.

As will be disclosed in subsequent drawing figures herein, the antifuse material 16 of the present invention may comprise various combinations of materials including silicon nitride, silicon dioxide, and amorphous silicon. For example, antifuse material 16 may comprise a layer of amorphous silicon and a layer of silicon nitride; a first layer of silicon nitride, a layer of amorphous silicon and a second layer of silicon nitride; a first layer of silicon nitride, a thin layer of silicon dioxide, a layer of amorphous silicon and a second layer of silicon nitride; a first layer of silicon nitride, a layer of amorphous silicon, a thin layer of silicon dioxide, and a second layer of silicon nitride; a layer of silicon nitride, a layer of amorphous silicon and a thin layer of silicon dioxide; a thin layer of silicon dioxide, a layer of amorphous silicon and a second layer of silicon nitride. In addition, other single layers, such as amorphous silicon, or combinations of layers such as various dielectrics may be used to form antifuse material 16.

When a single layer antifuse material is employed, and when combinations of materials are used to form a stacked antifuse material, typical thicknesses for amorphous silicon layers are in the range of from about 100 angstroms to about 1,500 angstroms, preferably about 450 angstroms. Typical thicknesses for the silicon nitride layer or layers are in the range of from about 1 angstrom to about 300 angstroms, preferably about 65 angstroms. Typical thicknesses for thin silicon dioxide layers are in the range of from about 1 angstrom to about 300 angstroms, preferably about 50 angstroms. Antifuse materials 16 according to the present invention may be formed using a variety of known deposition or other growth techniques, including PVD (physical vapor deposition) and CVD (chemical vapor deposition) techniques.

A first dielectric layer 18 is formed over antifuse material 16 and a via is formed therein communicating with the antifuse material 16. An upper antifuse electrode 20 is disposed in the first via and in contact with the upper surface of antifuse material 16. Upper antifuse electrode 20 preferably comprises a layer of titanium nitride having a thickness of from about 500 angstroms to about 3,000 angstroms, preferably about 2,000 angstroms, and is defined using conventional masking and etching steps. A second dielectric layer 22, formed from a material such as silicon dioxide to a thickness in the range of from about 3,000 angstroms to about 10,000 angstroms, preferably about 7,000 angstroms, is disposed over upper antifuse electrode 20.

A second via, preferably substantially in alignment with the first via, is formed in second dielectric layer 22 to expose the upper surface of upper antifuse electrode 20. A conductive layer 24 is disposed in the second via and in contact with upper antifuse electrode 20. Conductive layer 24 will most often comprise a metal interconnect layer in a microcircuit and will thus comprise materials which are known for use as such layers, but those of ordinary skill in the art will appreciate that conductive layer 24 could be formed from other materials.

In any integrated circuit containing antifuses fabricated in accordance with the present invention, conductive layer 24 will be covered by other layer such as are conventionally used to passivate the integrated circuit. These layers and their fabrication will not be disclosed herein, since they are well known and it is desired to avoid overcomplicating the disclosure of the present invention.

Figure 2:
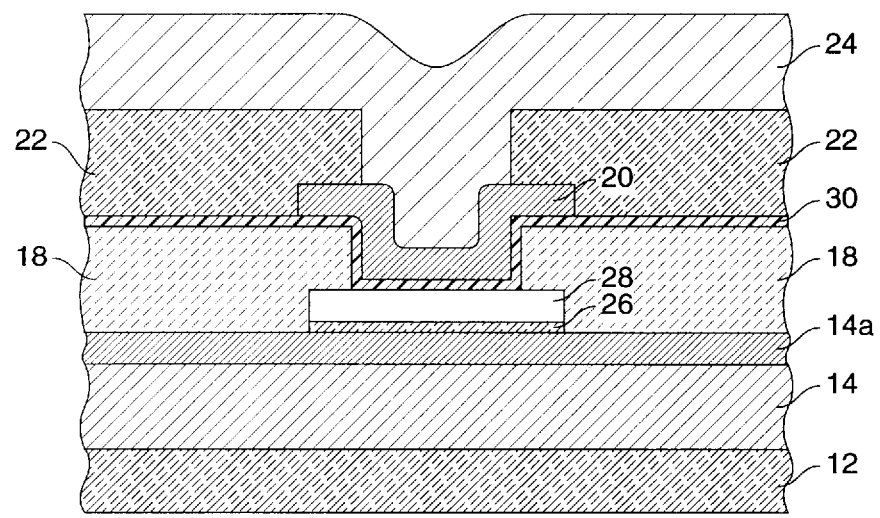
FIG. 2 is a cross-sectional view of an antifuse architecture according to a presently preferred embodiment of the invention.

Several variations on the antifuse architecture of FIG. 1 are considered to be particularly useful. One such variation is shown in FIG. 2. Lower electrode 14 is shown to include an optional barrier layer 14a, which may comprise a material such as titanium nitride having a thickness of between about 500 to 5,000 angstroms, preferably about 2,000 angstroms. According to a presently preferred embodiment of the present invention as may be seen from a detailed examination of FIG. 2, the antifuse material comprises a multilayer stacked structure.

In this embodiment of the invention, a portion of the stacked structure of antifuse material 16 is disposed directly over the lower electrode 14. In the particular embodiment of FIG. 2, antifuse material 16 includes a first layer of silicon nitride 26, covered by a layer of amorphous silicon 28. These layers are formed using known techniques and are then defined using a conventional masking and etching step to form a stack. A first dielectric layer 18, such as silicon dioxide having a thickness of between about 500 to 4,000 angstroms, is formed over the stack of silicon nitride 26 and amorphous silicon layer 28. First dielectric layer 18 has a first via formed therein to expose the upper surface of amorphous silicon layer 28. A layer 30, which may comprise a thin oxide layer or a second layer of silicon nitride, is formed in the via in contact with amorphous silicon layer 28. Together, layers 26, 28 and 30 form the antifuse material 16, but the third component 28 of the antifuse material is formed in the first via through first dielectric layer 18.

As will be appreciated by persons of ordinary skill in the art, the programming voltage exhibited by antifuse 10 will be a function of the materials from which antifuse material is formed as well as the thicknesses of the individual layers of these materials.

According to an alternate embodiment of the present invention, layer 30 may comprise a thin silicon dioxide layer having a thickness of between about 1 angstrom and 300 angstroms, preferably about 50 angstroms. Such an oxide could be deposited by techniques such as CVD.

Figure 3A:
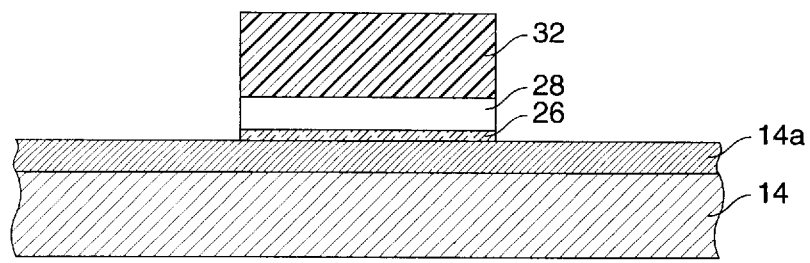
FIGS. 3a–3c are cross-sectional views of the antifuse of FIG. 2 taken after completion of selected steps during its fabrication.
Figure 3B:
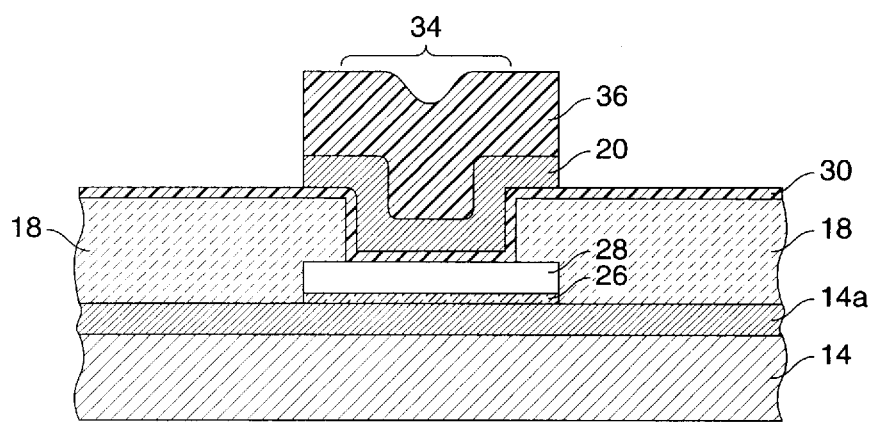
Figure 3C:
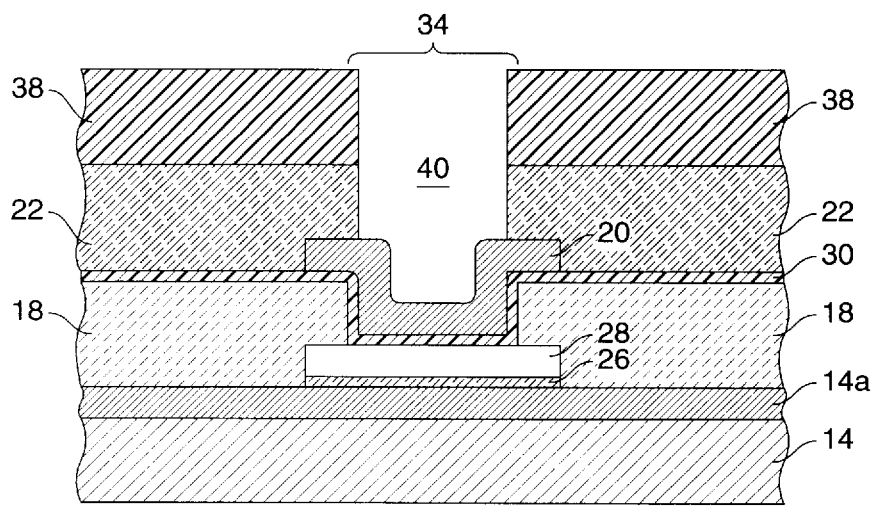

Referring now to FIGS. 3a–3c, cross sectional views are shown of the antifuse 10 of either FIG. 1 or FIG. 2 after completion of selected steps in its fabrication process. Referring first to FIG. 3a, conductive layer 14 and optional barrier layer 14a have been formed on the upper surface of insulating layer 12 to conventional thicknesses using conventional materials processing techniques.

The next step in the fabrication process is the formation of antifuse material 16. According to the presently preferred embodiment of the invention, a first layer of silicon nitride 26 is first formed using techniques such as CVD, having a thickness of from about 1 angstrom to about 300 angstroms, preferably about 65 angstroms. Next, a layer of amorphous silicon 28 is formed to a thickness of from about 100 angstroms to about 1,500 angstroms, preferably about 450 angstroms. The layer of amorphous silicon 28 may be undoped or may be doped to a concentration of less than about 1e18, using phosphorous, arsenic, nitrogen, or oxygen as a dopant species.

A conventional photomasking step is used to apply photomask 32, which is used as a mask to etch the portion of the antifuse material stack comprising the silicon nitride layer 26 and the amorphous silicon layer 28. This etch step may be performed using RIE or plasma techniques as is known in the art. FIG. 3a shows the structure resulting after performance of the stack etching step but prior to removal of photomask 32.

Referring now to FIG. 3b, first dielectric layer 18 is formed from a material such as silicon dioxide using techniques such as CVD. According to a presently preferred embodiment of the invention, first dielectric layer 18 is formed to a thickness of from about 500 angstroms to about 4,000 angstroms, preferably about 2,000 angstroms. A first via 34 is formed in first dielectric layer 18 to expose the upper surface of amorphous silicon layer 28 using conventional photolithography and etching techniques. A third layer 30 for the multilayer antifuse material 16 is then formed in first via 34 is in contact with the upper surface of amorphous silicon layer 28.

According to a presently preferred embodiment of the invention, third layer 30 of the multilayer antifuse material 16 comprises a thin layer of silicon dioxide, having a thickness in the range of from about 1 angstrom to about 300 angstroms, preferably about 50 angstroms. Alternately, a layer of silicon nitride, having a thickness in the range of from about 1 angstrom to about 300 angstroms, preferably about 65 angstroms, may be employed for layer 30.

Those of ordinary skill in the art will recognize an advantage of the antifuse architecture of the present invention in this portion of the structure. Because first dielectric layer 18 is only at most 4,000 angstroms thick, the issue of etch selectivity between the first dielectric layer 18 and the amorphous silicon layer 28 is little concern during the first via etch. In prior art antifuses having much thicker dielectric layers separating the upper and lower antifuse electrodes, this issue is of some concern because the requirement for overetch causes removal of an unpredictable amount of the amorphous silicon. This leads to an unpredictable spread in antifuse programming voltages among die from different production runs.

The upper antifuse electrode 20 is next formed and defined. First, the upper electrode 20 is formed by a technique such as blanket deposition from a material such as titanium nitride, to a thickness of between about 500 angstroms and 3,000 angstroms, preferably about 2,000 angstroms. Next, a photomask 36 is applied to the surface of the upper electrode 20 and the electrode is defined using conventional etching techniques. FIG. 3b shows the structure resulting after performance of the etching step but prior to removal of photomask 36.

Referring now to FIG. 3c, second dielectric layer 22 is formed from a material such as silicon dioxide to a thickness in the range of from about 3,000 angstroms to about 10,000 angstroms, preferably about 7,000 angstroms, using techniques such as CVD. A photomask 38 is placed over the surface of second dielectric layer 22 and a second via 40, substantially in alignment with first via 34, is formed to expose the upper surface of upper electrode 20. It should be appreciated that the second via 40 need only be formed so that the upper surface of upper electrode 20 is exposed. However, it should also be appreciated that the first and second vias 34 and 40 should preferably be in alignment if it is desired to achieve minimum geometry. FIG. 3c shows the structure resulting after performance of the second via etching step but prior to removal of photomask 38.

Finally, a conductive layer 24 is formed over second dielectric layer 22 and into second via 40. Conductive layer 24 will typically comprise a portion of a metal interconnect layer in the integrated circuit and its materials for its composition and formation and definition steps are thus well known in the art. FIG. 2 shows the completed antifuse structure after performance of the formation and definition steps for the conductive layer 24.

Despite the fact that an antifuse fabricated according to the architecture of the present invention requires three masks, one to define the stack, one to define the first via, and one to define the second via, it enjoys several advantages due to its unique structure. First, and as previously noted, since first dielectric layer 18 has a maximum thickness of only about 4,000 angstroms, there is little concern about the selectivity of the etch step which is used to form the first via. Selectivity is an issue in prior art antifuse structures since the overetch necessary to assure completely opening the via causes an uncontrolled amount of etching of the antifuse material, leading to an unacceptable spread of programming voltages across a population of devices.

Because the first dielectric layer 18 is relatively thin, an additional benefit is that the upper antifuse electrode 20 will not become thinned when deposited in the shallow via 34 opening as it would if it was deposited in a deeper via as in most prior art antifuse structures.

In addition, because the first dielectric layer 18 is relatively thin, there will be a minimal polymer residue from the prior masking step to remove prior to performing the deposition step for layer 30.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An antifuse comprising:

a conductive lower electrode having an upper surface;

a first layer of silicon nitride disposed on said upper surface of said lower electrode, said first layer of silicon nitride having an upper surface;

a layer of amorphous silicon disposed on said upper surface of said first layer of silicon nitride, said layer of amorphous silicon having an upper surface;

a first dielectric layer disposed on said upper surface of said amorphous silicon layer and having a first aperture therethrough communicating with said amorphous silicon layer, said first dielectric layer having an upper surface;

a second layer of silicon nitride disposed on said upper surface of said first dielectric layer and in said first aperture in contact with said layer of amorphous silicon, said second layer of silicon nitride having an upper surface;

a conductive upper electrode disposed on said upper surface of said second layer of silicon nitride, said conductive upper electrode having an upper surface;

a second dielectric layer is disposed on said upper surface of said conductive upper electrode having a second aperture therethrough communicating with said conductive upper electrode, said second dielectric layer having an upper surface; and an overlying metal layer disposed over said upper surface of said second dielectric layer and in said second aperture making electrical and physical contact with said conductive upper electrode.

2. An antifuse comprising:

a conductive lower electrode having an upper surface;

a layer of silicon nitride disposed on said upper surface of said lower electrode, said first layer of silicon nitride having an upper surface;

a layer of amorphous silicon disposed on said upper surface of said layer of silicon nitride, said layer of amorphous silicon having an upper surface;

a first dielectric layer disposed on said upper surface of said amorphous silicon layer and having a first aperture therethrough communicating with said amorphous silicon layer, said first dielectric layer having an upper surface;

a layer of silicon dioxide disposed on said upper surface of said first dielectric layer and in said first aperture in contact with said layer of amorphous silicon, said layer of silicon dioxide having an upper surface;

a conductive upper electrode disposed on said upper surface of said layer of silicon dioxide, said conductive upper electrode having an upper surface;

a second dielectric layer is disposed on said upper surface of said conductive upper electrode having a second aperture therethrough communicating with said conductive upper electrode, said second dielectric layer having an upper surface; and an overlying metal layer disposed over said upper surface of said second dielectric layer and in said second aperture making electrical and physical contact with said conductive upper electrode.

* * * * *